(12) United States Patent
Haga et al.

(10) Patent No.: US 8,501,625 B2
(45) Date of Patent: Aug. 6, 2013

(54) POLISHING LIQUID FOR METAL FILM AND POLISHING METHOD

(75) Inventors: Kouji Haga, Hitachi (JP); Masato Fukasawa, Hitachi (JP); Jin Amanokura, Hitachi (JP); Hiroshi Nakagawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 211 days.

(21) Appl. No.: 12/668,096

(22) PCT Filed: Jul. 8, 2008

(86) PCT No.: PCT/JP2008/062352
§ 371 (c)(1),
(2), (4) Date: Jan. 7, 2010

(87) PCT Pub. No.: WO2009/008431
PCT Pub. Date: Jan. 15, 2009

(65) Prior Publication Data
US 2010/0323584 A1 Dec. 23, 2010

(30) Foreign Application Priority Data
Jul. 10, 2007 (JP) ................................. 2007-180928

(51) Int. Cl.
*C09G 1/02* (2006.01)
*C09G 1/04* (2006.01)

(52) U.S. Cl.
USPC .............. 438/693; 438/691; 252/79.1; 51/307

(58) Field of Classification Search
USPC ....... 451/36; 252/79.1; 438/691–693; 51/307
See application file for complete search history.

(56) References Cited

U.S. PATENT DOCUMENTS

| 4,944,836 | A | | 7/1990 | Beyer et al. | |
| 5,902,173 | A | * | 5/1999 | Tanaka | ............................ 451/56 |

(Continued)

FOREIGN PATENT DOCUMENTS

| EP | 1 533 352 A1 | 5/2005 |
| JP | 62-102543 A | 5/1987 |

(Continued)

OTHER PUBLICATIONS

Supplementary European Search Report dated Oct. 20, 2010, issued in corresponding European Patent Application No. 08777961.7.

(Continued)

*Primary Examiner* — Pegah Parvini
(74) *Attorney, Agent, or Firm* — Westerman, Hattori, Daniels & Adrian, LLP

(57) ABSTRACT

The invention relates to a polishing liquid for metal film comprising 7.0% by weight or more of an oxidizer for metal, a water-soluble polymer, an oxidized metal dissolving agent, a metal anticorrosive agent and water, provided that the total amount of the polishing liquid for metal film is 100% by weight, wherein the water-soluble polymer has a weight average molecular weight of 150,000 or more and is at least one member selected from among a polycarboxylic acid, a salt of a polycarboxylic acid, and a polycarboxylic acid ester. According to the invention, provided is a polishing liquid for metal film, by which polishing can be performed at a high rate even under a polishing pressure as low as 1 psi or lower, and such that a polished film after polishing is excellent in planarity, furthermore, with which a high polishing rate can be obtained even in an initial stage of polishing, and provided is a polishing method using the polishing liquid.

5 Claims, 4 Drawing Sheets

U.S. PATENT DOCUMENTS

| | | | |
|---|---|---|---|
| 2002/0016073 A1* | 2/2002 | Kondo et al. | 438/691 |
| 2003/0186497 A1 | 10/2003 | Kondo et al. | |
| 2003/0219982 A1* | 11/2003 | Kurata et al. | 438/692 |
| 2004/0171264 A1 | 9/2004 | Kondo et al. | |
| 2006/0000151 A1 | 1/2006 | Kelley et al. | |

FOREIGN PATENT DOCUMENTS

| | | |
|---|---|---|
| JP | 2-278822 A | 11/1990 |
| JP | 2002-50595 A | 2/2002 |
| JP | 2004-311565 A | 11/2004 |
| TW | 200300168 | 5/2003 |

OTHER PUBLICATIONS

Kaufman, F.B. et al, "Chemical-Mechanical Polishing for Fabricating Patterned W Metal Features as Chip Interconnects", Journal of the Electrochemical Society, Nov. 1998, vol. 138, No. 11, pp. 3460-3464.

International Search Report of PCT/JP2008/062352, mailing date of Aug. 5, 2008.

Notification of Trasmittal of Translation of the International Preliminary Report on Patentability (Form PCT/IB/373) of International Application No. PCT/JP2008/062352 mailed Feb. 4, 2010 with Forms PCT/IB/373 and PCT/ISA/237.

Japanese Office Action dated Oct. 30, 2012, issued in corresponding Japanese Patent Application No. 2009-522652, with English translation (5 pages).

Taiwanese Office Action dated Jul. 11, 2012, issued in corresponding Taiwanese Patent Application No. 10120691770, (10 pages). With English Translation.

* cited by examiner

FIG. 2
(a)
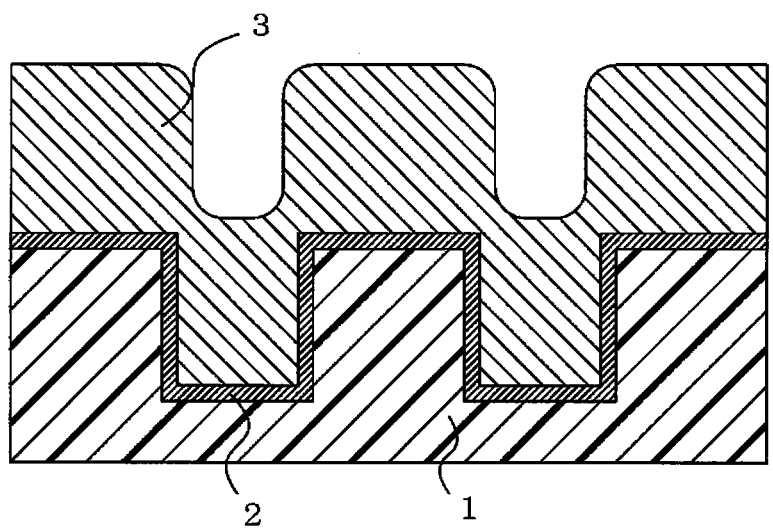
(b)
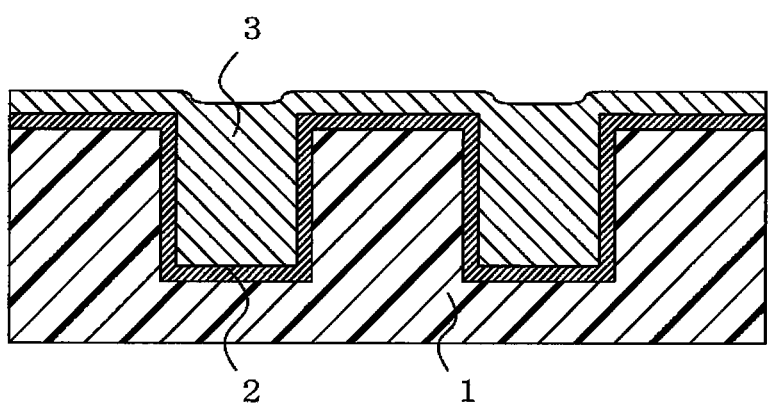
(c)
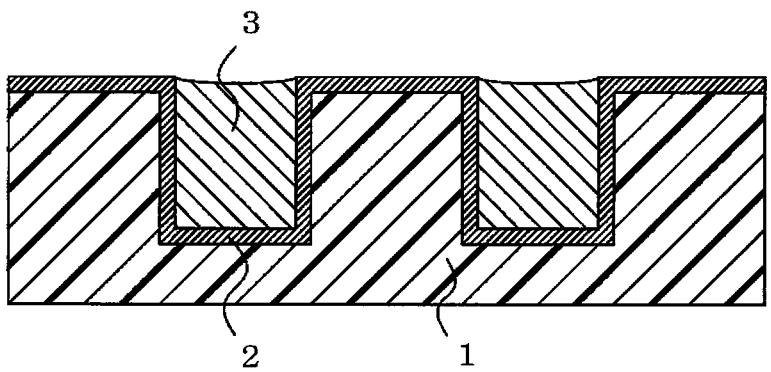

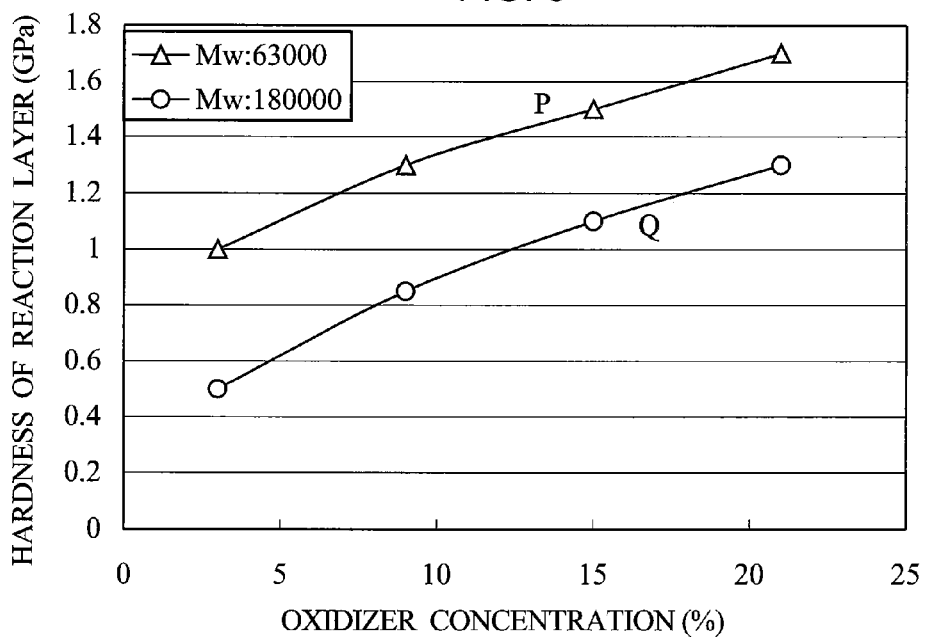
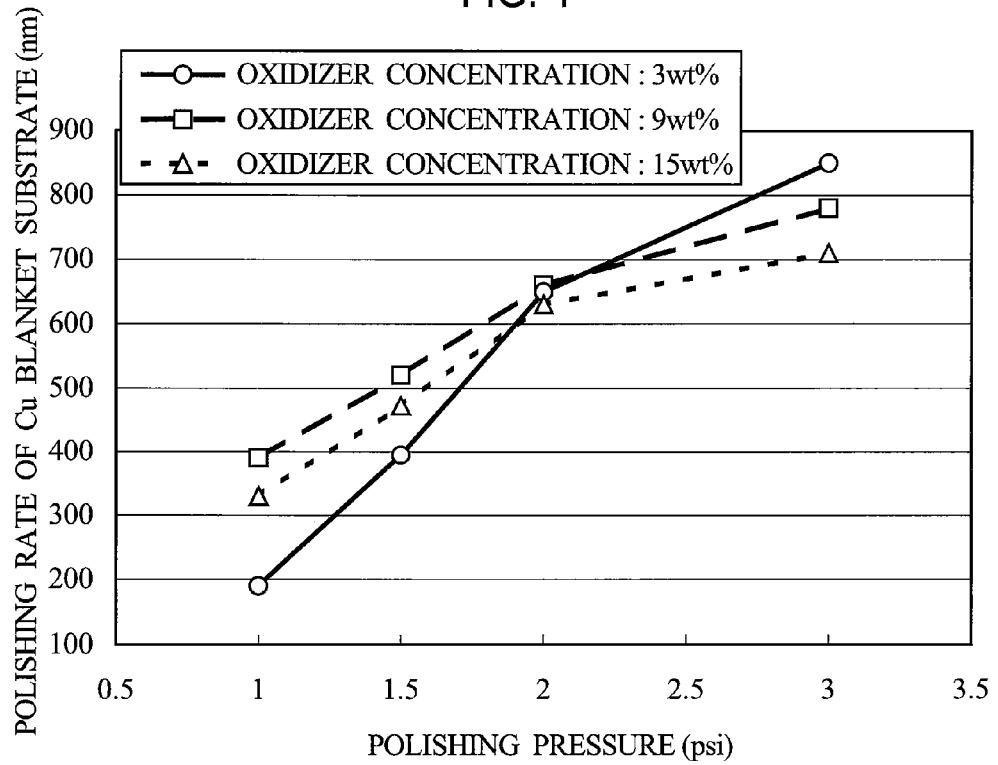

POLISHING LIQUID FOR METAL FILM AND POLISHING METHOD

TECHNICAL FIELD

The present invention relates to a polishing liquid for metal film to be used especially in the step of wiring of semiconductor devices, and a polishing method using the same.

BACKGROUND ART

Fine processing techniques have been developed in accordance with high integration and high performance of semiconductor integrated circuits (abbreviated as LSIs hereinafter) in recent years. A chemical mechanical polishing (hereinafter, CMP) process is one of them and is a technique that is used often in the LSI manufacturing process, particularly in the planarization of interlayer dielectrics, formation of metal plugs, and formation of buried wirings in a multilayer wiring formation process. The technique is, for example, disclosed in U.S. Pat. No. 4,944,836.

Uses of copper and copper alloys as conductive substances to be wiring materials have been attempted in recent years in order to attain high performance of LSIs. It, however, is difficult for copper or copper alloy (henceforth, sometimes referred to simply as copper based metal) to be finely processed by dry etching that have often been used in conventional formation of aluminum alloy wiring.

Accordingly, a Damascene process, in which a thin film of wiring metal such as a copper based metal is deposited on an insulating film having grooves so that the grooves may be buried therewith and then the thin film is removed by CMP at areas except for those buried in the grooves to form embedded wiring, has been mainly employed. This technique is disclosed in Japanese Patent Application Laid-Open No. 2-278822, for example.

A conventional method of CMP of metal for polishing the aforementioned copper based metal comprises the steps of bonding a polishing pad to a circular polishing platen, pressing the surface of a substrate with a metal film formed thereon onto the surface of the polishing pad while the polishing pad surface is impregnated with a polishing liquid for metal film, rotating the polishing platen while a prescribed pressure (hereinafter, referred to as a polishing pressure) is applied from the back face of the polishing pad, and removing the metal film on projections by relative mechanical friction between the polishing liquid and the projections of the metal film.

A polishing liquid for metal film to be used for CMP generally contains an oxidizer, polishing particles and water. An oxidized metal dissolving agent and a metal anticorrosive agent are further added thereto, according to necessity. In a presumptive basic mechanism, a surface of metal film is oxidized first with an oxidizer to form an oxidized layer and then the oxidized layer is scraped with polishing particles. Since the oxide layer on the surface of the metal film in a depression seldom comes into contact with the polishing pad and therefore is not subjected to the effect of scraping with the polishing particles, the oxidized layer of the metal film on the projection is removed with the advance of CMP and the surface of the substrate is planarized. The details of this mechanism are disclosed in Journal of Electrochemical Society, 1991, Vol. 138, No. 11, pp. 3460-3464.

It has been known that addition of an oxidized metal dissolving agent to a polishing liquid for metal film is effective as a method for increasing the polishing rate by CMP. It is interpreted that this is because the scraping effect with the polishing particles is enhanced by dissolving particles of the metal oxide scraped with the polishing particles into the polishing liquid (this process is referred to as "etching").

However, the oxidized layer of the surface of the metal film in a depression may also be etched. Therefore, repetition of a process that the oxidized layer on the surface of the metal film in a depression is etched and the metal film surface exposed is further oxidized with the oxidizer allows etching of the metal film in the depression to advance. That is, there is a fear that the planarizing effect is impaired. In order to prevent such excessive etching of a depression, a metal anticorrosive agent is further added to a polishing liquid for metal film.

However, the buried wiring formation by the conventional CMP result in problems, such as (1) occurrence of a phenomenon that a central portion of the surface of buried wiring metal is corroded isotropically to depress like a dish (dishing), and occurrence of a phenomenon that a dielectric is also polished in a portion high in wiring density, so that the thickness of the wiring metal decreases (erosion or thinning), (2) development of polishing scratches, (3) that the washing process for removing a polishing dust remaining on the substrate surface after polishing is troublesome; (4) cost rising caused by waste liquid treatment, and (5) corrosion of metal.

In order to inhibit the dishing from occurring or a copper based metal from corroding during the polishing, and to form highly reliable LSI wirings, a method of using a polishing liquid for metal which contains an oxidized metal dissolving agent composed of amino acetic acid, e.g., glycine, or amidosulfuric acid, and benzotriazole has been proposed. This technique is disclosed in, e.g., Japanese Patent Application Laid-open No. 8-83780.

In FIG. 1, wiring formation by a common Damascene process is depicted in a schematic cross-sectional diagram. FIG. 1(a) illustrates a state before polishing, including interlayer dielectrics 1 having grooved formed on the surface, barrier layer 2 formed so that it may follow surface irregularities of the interlayer dielectrics 1, and wiring metal 3 of copper or copper alloy deposited so that the irregularities may be buried.

First, as depicted in FIG. 1(b), wiring metal 3 is polished with a polishing liquid for wiring metal polishing until barrier layer 2 becomes exposed. Next, as depicted in FIG. 1(c), polishing is performed with a polishing liquid for barrier layer 2 until a projection of interlayer dielectrics 1 becomes exposed. At this time, an operation of polishing the interlayer dielectrics excessively, i.e., so-called overpolishing, may be performed. Moreover, there also is a step of polishing with a single polishing liquid from the state of FIG. 1(a) through the state of FIG. 1(c).

As described above, while various CMP polishing liquids have been disclosed, it is common that polishing is performed in one step in the step of polishing wiring metal. Moreover, as to the polishing pressure, it has been common that polishing is performed under a relatively high pressure, for example, a pressure of 3 psi or more, in order to increase the throughput by polishing at a high rate.

A unit of pressure "psi" is pound per square inch and it is not an SI unit. However, since it is generally used in the semiconductor industry, the "psi" is used also in this specification. It is noted that 1 psi is a pressure equivalent to about 6.89 kPa and is sometimes expressed as about 7 kPa 1 psi may be set to about 7 kPa for the purpose of simplification.

Incidentally, the influence of signal delay of wiring metal has recently been becoming disregardable as the wiring width becomes smaller every year. Then, a technology of using an interlayer dielectric with a small dielectric constant is being researched in order to reduce the signal time. However, since such interlayer dielectrics are generally low in mechanical strength, layered film structures including such interlayer dielectrics are also low in mechanical strength. For this reason, there was a problem that wiring defects are caused easily by, for example, peeling in a laminated film interface due to polishing stress generated during a CMP process.

In order to improve the above-mentioned problem, a method that wiring metal is polished in two stages as shown in FIG. 2 is starting to be used, and it seems to have become the mainstream since around 2005. This method has first-stage polishing for roughly scraping wiring metal first from the state of FIG. 2(a) to the state of FIG. 2(a) where a little wiring metal remains, and second-stage polishing for finish polishing from the state of FIG. 2(b) to the step of FIG. 2(c) where barrier metal becomes substantially exposed.

In the first-stage polishing, polishing is performed under a relatively high pressure (e.g., 2-3 psi) for high-rate polishing and in the second-stage polishing, polishing is performed under a low pressure in order to minimize the influence to an interlayer dielectric. The polishing pressure used in the second stage is usually adjusted to a pressure of 1.5 to 2 psi.

DISCLOSURE OF THE INVENTION

Problem to be Solved by the Invention

The polishing pressure in the second-stage is preferably lower from the viewpoint of reducing the damage to the interlayer dielectric. However, the conventional polishing liquids have a property that a satisfactory polishing rate can be obtained at high pressures of 3 psi or more, but the polishing rate decreases rapidly at low polishing pressures as low as 2 psi or less, especially lower than 1.5 psi. Therefore, there is a problem that a sufficient throughput cannot be obtained if the polishing pressure is lowered for reducing the damage of an interlayer dielectric.

The conventional polishing liquids were slow in initial polishing rate. That is, although a satisfactory polishing rate can be obtained once polishing starts, polishing does not advance at all or the polishing rate is low just after the start of a polishing process. This tendency becomes more remarkable as the polishing pressure decreases. This is the reason why the polishing pressure is at least about 2 psi in the conventional polishing methods. However, a polishing liquid with which a high polishing rate can be obtained even in an initial stage of polishing has been desired from the viewpoint of improving the polishing efficiency.

One object of the present invention is to provide a polishing liquid for metal film by which polishing can be performed at a high rate even under a low polishing pressure of lower than 1.5 psi (e.g., 1 psi or lower) and a polishing method using the same. Another object of the present invention is to provide a polishing liquid for metal film with which a high polishing rate can be obtained even in an initial stage of polishing and a polishing method using the same.

The improvement in polishing rate have been researched widely not only under low polishing pressures. For example, there is a method of increasing the polishing rate by increasing the influence of mechanical polishing by increasing the added amount of polishing particles. However, while the polishing rate is increased by increasing polishing particles, there is a problem that the planarity after the completion of polishing is lost because polishing advances regardless of irregularities of the surface. Moreover, a technique that the content of an organic acid or a carboxylic acid based polymer is increased and a technique that wiring metal is made easier to be polished by reducing the pH have been researched. However, although both techniques can increase the polishing rate to some extent, there, at the same time, are problems that wiring metal is polished excessively to increase the amount of dishing or that the etching rate becomes greater.

Means for Solving the Problem

The present inventors have researched a polishing liquid containing a water-soluble polymer and a metal anticorrosive agent, and they have found in this course that a water-soluble polymer and a metal anticorrosive agent form a reaction layer together with a wiring metal like copper. The reaction layer seems a layer different from the protective layer formed on the surface of a copper based metal by the action of the metal anticorrosive agent contained in the conventional polishing liquids. Moreover, it is presumed that polishing advances through the removal of the reaction layer at the time of polishing.

Then, the present inventors thought that, for example, a high polishing rate could be obtained even under a low polishing pressure and problems with respect to planarity and initial polishing rate could be solved by controlling the reaction layer into a proper embodiment. As a result of much research, the inventors presumed that a reaction layer formed by a conventional polishing liquid is very thin and hard and therefore satisfactory polishing properties were difficult to be obtained. In other words, they presumed that the fact that a reaction layer is thin is equal to the fact that a layer to be polished is thin and, as a result, the polishing rate became slower. Moreover, they presumed that since the reaction layer was hard, a satisfactory polishing rate was obtained when the polishing pressure was high, whereas the reaction layer was difficult to be scraped and therefore the polishing rate decreased rapidly when the polishing pressure was low.

Therefore, researches were conducted on the basis of the idea that a favorable polishing rate at a low polishing pressure and the problems of planarity and initial polishing rate can be solved by rendering the reaction layer "thick and soft." As a result, it was found that a "thick and soft" reaction layer like that described above could be formed by using a metal anticorrosive agent and a polycarboxylic acid based polymer having a relatively large molecular weight together and increasing the concentration of an oxidizer, and the present invention has been accomplished.

One of more specific embodiments of the present invention is a polishing liquid for metal film comprising 7.0% by weight or more of an oxidizer for metal, a water-soluble polymer, an oxidized metal dissolving agent, a metal anticorrosive agent and water, provided that the total amount of the polishing liquid for metal is 100% by weight, wherein the water-soluble polymer has a weight average molecular weight of 150,000 or more and is at least one member selected from among a polycarboxylic acid, a salt of a polycarboxylic acid, and a polycarboxylic acid ester.

The disclosure of the present application is related to the theme described in Japan Patent Application No. 2007-180928 filed Jul. 10, 2007, the disclosure of which is incorporated herein by reference.

Effect of the Invention

Since the polishing liquid of the present invention contains a water-soluble polymer having a high molecular weight, a polishing liquid for metal film by which polishing can be performed at a high speed even under a polishing pressure as low as 1 psi or lower and a polishing method using the polishing liquid can be provided.

Moreover, since the polishing liquid of the present invention uses a water-soluble polymer, a metal anticorrosive agent, and an oxidizer in combination and a prescribed amount or more of the water-soluble polymer is added, a polishing liquid for metal film excellent in planarity of a film polished after polishing and a polishing method using the same can be provided.

Furthermore, since the polishing liquid of the present invention contains a water-soluble polymer having a high molecular weight, a polishing liquid for metal film with which a high polishing rate can be obtained even in an initial stage of polishing and a polishing method using the same can be provided.

BRIEF DESCRIPTION OF THE DRAWINGS

FIG. 1(a) shows a state before polishing. FIG. 1(b) shows a state that wiring metal has been polished until a barrier layer is exposed. FIG. 1(c) shows a state that polishing has been performed until projections of an interlayer dielectric is exposed.

FIG. 2 is a schematic cross-sectional diagram showing the progress of a method by which a product is obtained by polishing the wiring metal of FIG. 1 in two stages. FIG. 2(a) shows a state before polishing. FIG. 2(b) shows a state that wiring metal has been scraped roughly until wiring metal remains a little. FIG. 2(c) shows a state that finish polishing has been performed until bather metal is substantially exposed.

FIG. 3 is a graph that shows the relationship between the oxidizer concentration in a polishing liquid and the hardness of a reaction layer.

FIG. 4 is a graph that shows the relationship between the polishing rate of a copper film and the polishing pressure when the oxidizer concentration is changed.

Figure 1:
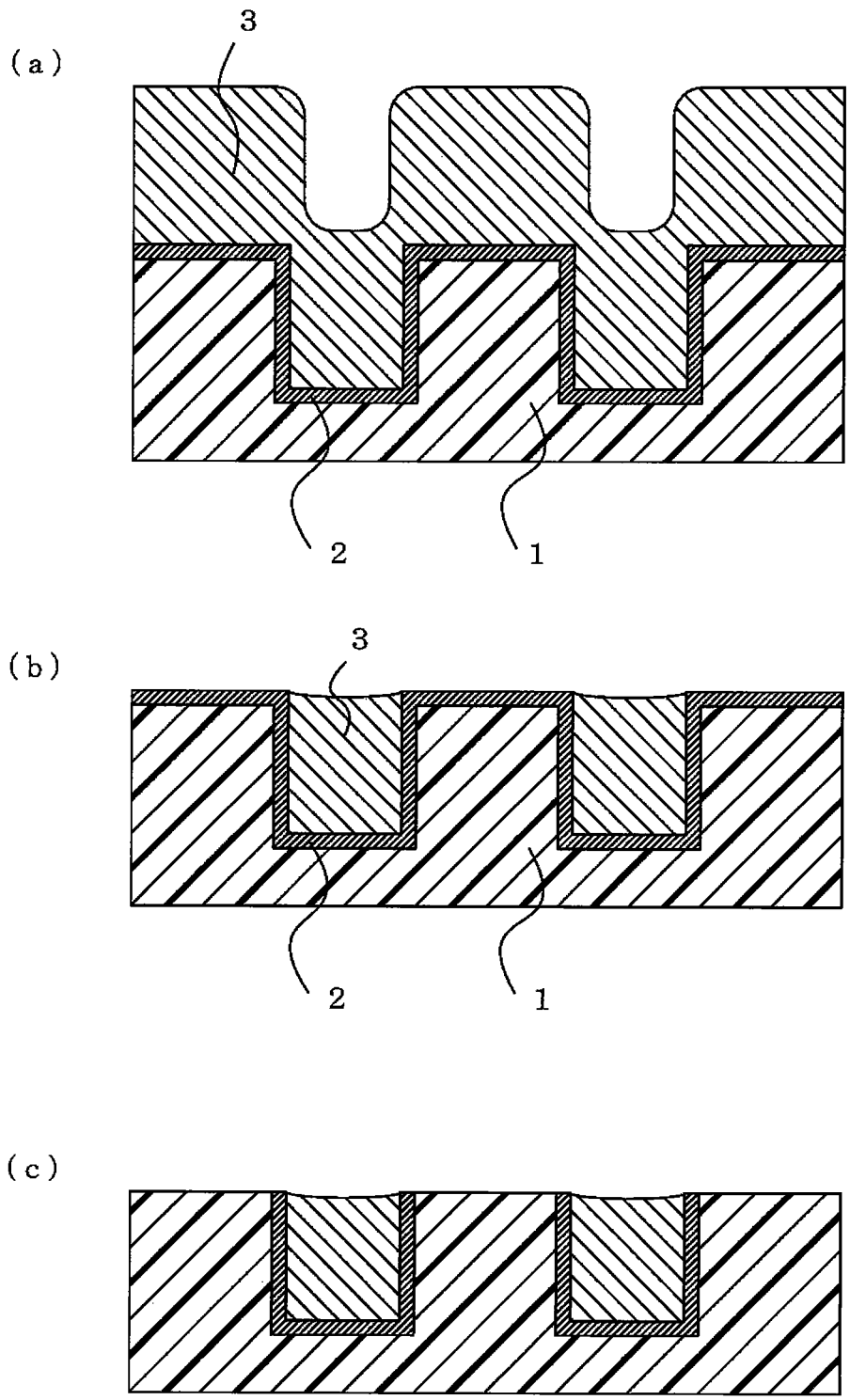
FIG. 1 is a schematic cross-sectional diagram showing the progress of a common Damascene process.

| Explanation of Reference Numerals | |
|---|---|
| 1 | Interlayer dielectrics |
| 2 | Barrier layer |
| 3 | Wiring metal |
| 4 | Particle |
| 5 | Circumscribed rectangle |
| L | Major axis of circumscribed rectangle |
| B | Minor axis of circumscribed rectangle |

BEST MODE FOR CARRYING OUT THE INVENTION

A typical embodiment of the polishing liquid for metal film of the present invention is a polishing liquid for metal film containing an oxidizer for metal, an oxidized metal dissolving agent, a metal anticorrosive agent, a water-soluble polymer, and water. The respective components are described in detail below.

(Water-Soluble Polymer)

As for the polishing liquid of the present invention, it is important to use a water-soluble polymer having a weight average molecular weight (hereinafter sometimes referred to as Mw) of 150,000 or more. When the weight average molecular weight is 150,000 or more, it is possible to make a reaction layer of a metal anticorrosive agent mentioned later and a copper based metal be "thick and soft" one, and it becomes easy to attain such characteristics as high speed polishing, planarity, and a high initial polishing rate under a low polishing pressure. In other words, it is possible to obtain a polishing liquid that exhibits smaller changes in polishing rate or planarity even under a low polishing pressure in comparison to the case under a high polishing pressure. For example, when comparing the polishing rate under a polishing pressure of 1 psi and the polishing rate under a polishing pressure of 2 psi, the ratio thereof is preferably 2.5 or less, and more preferably 2.0 or less. The comparison of polishing rate can be determined from the polishing rate of a blanket wafer.

While the weight average molecular weight of the water-soluble polymer is 150,000 or more, high speed polishing can be performed even under a polishing pressure as low as 1.0 psi or lower, and the weight average molecular weight of the water-soluble polymer is preferably 160,000 or more, more preferably 180,000 or more, and particularly preferably 200,000 or more because a high polishing rate can be obtained in an initial stage of polishing. The upper limit of the weight average molecular weight of the water-soluble polymer, which is not particularly limited, is preferably 5,000,000 or less from the viewpoint of solubility, and more preferably 1,000,000 or less from the viewpoint of forming a good reaction layer.

The weight average molecular weight of the water-soluble polymer can be measured by gel permeation chromatography using a calibration curve of standard polystyrenes. For example, it can be measured by the method shown below.

Device used: HPLC pump (L-7100, manufactured by Hitachi, Ltd.) equipped with a differential refractometer (Model No. L-3300, manufactured by Hitachi, Ltd.)

Column: Shodex Asahipak GF-710HQ (product name, manufactured by Showa Denko K.K.)

Mobile phase: mixed solution of 50 mM aqueous disodium hydrogenphosphate solution/acetonitrile=90/10 (V/V)

Flow rate: 0.6 ml/min.

Column temperature: 25° C.

Since a reaction layer with a metal anticorrosive agent described later can be controlled, the water-soluble polymer to be used in the present invention is preferably a polycarboxylic acid based polymer having a carboxylic acid group in the molecular skeleton thereof, and specifically is preferably at least one member selected from among a polycarboxylic acid, a salt of a polycarboxylic acid, and a polycarboxylic acid ester.

More specifically, it is more preferably a polyacrylic acid based polymer, for example, and even more preferably polymethacrylic acid, an ammonium salt of polyacrylic acid, polyacrylamide, esters thereof, and ammonium salts thereof, and particularly preferably polyacrylic acid.

The polyacrylic acid based polymer having a weight average molecular weight of 150,000 or more can form a suitable reaction layer by using a metal anticorrosive agent together, and such a behavior is remarkable especially with a polyacrylic acid having a weight average molecular weight of 150,000 or more. That is, when a polyacrylic acid having a weight average molecular weight of 150,000 or more and a metal anticorrosive agent are used together, a thicker and softer reaction layer is formed as compared with the case of using a polyacrylic acid having a weight average molecular weight of less than 150,000.

When wafers in which copper film had been formed on a silicon substrate were immersed in two polishing liquids respectively containing a polyacrylic acid having weight average molecular weight of 180,000 or 63,000, 1,2,4-triazole and 15 wt % aqueous hydrogen peroxide solution, and then the thickness and the hardness of the reaction layers formed respectively, it was found that the former polishing liquid (weight average molecular weight of 180,000) formed a reaction layer about 130 nm in thickness and 1.5 Gpa in hardness and that the latter polishing liquid (weight average molecular weight of 63,000) formed a reaction layer about 100 nm in thickness and about 1.05 Gpa in hardness.

From the viewpoint of obtaining both a polishing rate at a low polishing pressure and a higher initial polishing rate, the incorporated amount of the water-soluble polymer is preferably 0.01% by weight or more where the overall amount of the polishing liquid for metal is let be 100% by weight. Since it is possible to obtain the above-mentioned effect and moreover to reduce the amount of dishing of wiring metal and reduce the accumulation of an object to be polished on a polishing cloth, the incorporated amount is more preferably 0.05% by weight or more, and even more preferably 0.1% by weight or more. The reason why such a relatively large incorporated amount is preferred is probably that the amount of the water-soluble polymer needed for forming a thin reaction layer is large.

Therefore, the formation of a reaction layer itself is not influenced very much even if the incorporated amount is increased excessively. However, since the etching rate becomes high and it becomes difficult in some cases to simultaneously achieve both a polishing rate and its in-plane uniformity well, the water-soluble polymer is preferably incorporated in an amount of 10% by weight or less, more preferably 5% by weight or less, and even more preferably 2% by weight or less.

(Metal Anticorrosive Agent)

The metal anticorrosive agent to be used in the present invention include compounds that can be adsorbed to the surface of wiring metal, such as copper, to form a strong protective layer. Specific examples include compounds having a triazole skeleton, compounds having a pyrimidine skeleton, compounds having an imidazole skeleton, compounds having a guanidine skeleton, compounds having a thiazole skeleton, and compounds having a pyrazole skeleton. These can be used alone or as a combination of two or more of them.

Examples of the compounds having a triazole skeleton include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexyl benzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl] phosphonic acid, 3-aminotriazole and 5-methyl benzotriazole.

Examples of the compounds having an imidazole skeleton include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole.

Examples of the compounds having a pyrimidine skeleton include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidinesulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidepyrimidine, 2-aminopyrimidine, 2-methyl-5,7-diphenyl-(1,2,4)triazolo[1,5-a]pyrimidine, 2-methylsulfanyl-5,7-diphenyl(1,2,4)triazolo[1,5-a]pyrimidine, 2-methylsulfanyl-5,7-diphenyl-4,7-dihydro-(1,2,4)triazolo[1,5-a]pyrimidine and 4-aminopyrazolo[3,4-d]pyrimidine.

Examples of the compounds having the guanidine skeleton include 1,3-diphenyl guanidine and 1-methyl-3-nitroguanidine.

Examples of the compounds having a thiazole skeleton include 2-mercaptobenzothiazole, 2-aminothiazole, 4,5-dimethylthiazole, 2-amino-2-thiazoline, 2,4-dimethylthiazole, and 2-amino-4-methylthiazole.

Examples of the compounds having a pyrazole skeleton include 3,5-dimethylpyrazole, 3-methyl-5-pyrazolone, 3-amino-5-methylpyrazole, 3-amino-5-hydroxypyrazole, and 3-amino-5-methylpyrazole.

Among those listed above, 1,2,3-triazole, 1,2,4-triazole, 3-amino-1H-1,2,4-triazole, 4-amino-4H-1,2,4-triazole, benzotriazol, 1-hydroxybenzotriazol, 5-methylbenzotriazol, 4-aminopyrazolo[3,4-d]pyrimidine, 1,2,4-triazolo[1,5-a]pyrimidine, 2-methyl-5,7-diphenyl-(1,2,4)triazolo[1,5-a]pyrimidine, and 2-methylsulfanyl-5,7-diphenyl-(1,2,4)triazolo[1,5-a]pyrimidine are preferable because of being excellent in a function as a usual anticorrosive and being able to achieve both a high polishing rate and a low etching rate simultaneously.

From the viewpoint of forming a thick and soft reaction layer as described above, it is preferable to use a triazole compound selected from among 1,2,3-triazole, 1,2,4-triazole, 3-amino-1H-1,2,4-triazole, 4-amino-4H-1,2,4-triazole, benzotriazole, 1-hydroxybenzotriazole, and 5-methybenzotriazole. When a polyacrylic acid based polymer (especially, polyacrylic acid) is used as the water-soluble polymer, 1,2,3-triazole, 1,2,4-triazole, and benzotriazole are more preferable because of being able to form a good reaction layer.

The incorporated amount of the metal anticorrosive agent is preferably 0.001% by weight or more, more preferably 0.01% by weight or more, and even more preferably 0.02% or more where the overall amount of the polishing liquid for metal is let be 100% by weight because of becoming easier to control etching and being able to form a good reaction layer. Since a protective layer to a surface of a metal film becomes so firm that a polishing rate suitable for practical use may not be obtained when the incorporated amount is excessively large, it is preferable, in such a case, to adjust the incorporated amount to 2.0% by weight or less relative to 100% by weight of the overall amount of the polishing liquid for metal.

(Oxidizer for Metal)

The oxidizer for metal to be used in the present invention (hereinafter, sometimes referred to simply as an oxidizer) may be any oxidizer capable of oxidizing copper based metal, which is wiring metal. Specific examples include hydrogen peroxide, ammonium persulfate, a ferric nitrate, nitric acid, potassium periodate, hypochlorous acid, and ozone water. Among these, hydrogen peroxide is particularly preferred because of being able to aid in forming an ideal reaction layer. These oxidizers for oxidizing metal may be used solely or as a combination of two or more of them.

Since contamination with alkali metals, alkali earth metals or halogenated compounds is not desirable when the substrate to be applied is a silicon substrate containing semiconductor elements, oxidizers containing no non-volatile components are desirable. Since ozone water exhibits a great change in composition with time, hydrogen peroxide is most suitable from such a viewpoint.

The incorporated amount of an oxidizer for metal should be chosen carefully because it exerts an influence on the polishing rate at a low polishing pressure. Although the oxidizer is generally used also in conventionally known polishing liquids, the incorporated amount thereof is not a factor which may be simply increased or decreased as is clear from the fact that its kind and a preferable incorporated amount vary according to the type of a polishing liquid and an object to be polished.

FIG. 3 is a graph produced by plotting the oxidizer concentration of a polishing liquid in abscissa and the hardness of a reaction layer in ordinate. The hydrogen peroxide concentration was adjusted by the incorporated amount of 30 wt % aqueous hydrogen peroxide solution and was plotted as the amount of hydrogen peroxide actually incorporated. In FIG. 3, hollow circles (○) are plots of a polishing liquid containing a water-soluble polymer having a molecular weight of 180,000 and a metal anticorrosive agent in combination and hollow triangles (Δ) are plots of a polishing liquid containing a water-soluble polymer having a molecular weight of 63,000 and a metal anticorrosive agent in combination. Among these, point P and point Q respectively correspond to polishing liquid E and polishing liquid A both described in Examples provided below, and the other points correspond to polishing liquids in which only the oxidizer concentration was changed. As is clear from FIG. 3, it can be understood that the larger the molecular weight of the water-soluble polymer is the softer the reaction layer becomes at any oxidizer concentration.

Furthermore, what is understood from FIG. 3 is that in a system where a water-soluble polymer and a metal anticorrosive agent are used together, a reaction layer formed on a surface of a film to be polished tends to become harder as the oxidizer concentration increases. In conclusion, a lower oxidizer concentration is better in order to make a reaction layer relatively "soft."

However, the present inventors found that there was a specific relationship between the polishing pressure and the oxidizer concentration in a system where a water-soluble polymer and a metal anticorrosive agent are used together. FIG. 4 is a graph in which the polishing pressure is plotted in abscissa and the polishing rate of a copper film is plotted in ordinate. What was examined is how the relationship between the polishing pressure and the polishing rate changes when the concentration of hydrogen peroxide as an oxidizer is changed in a polishing liquid in which a water-soluble polymer and a metal anticorrosive agent are used together. The oxidizer concentration is 3% by weight for hollow circles (○), 9% by weight for hollow quadrangles (□), and 15% by weight for hollow triangles (Δ).

FIG. 4 clearly shows that the lower the oxidizer concentration is the higher the polishing rate is exerted in the range of the polishing pressure that has been used usually (about 3 psi or more) and that the polishing rate of a polishing liquid low in oxidizer concentration decreases rapidly near a point where the polishing pressure becomes lower than 2 psi. While the reason why such a tendency is shown is unknown, it seems that at least a sufficiently high polishing rate at a low polishing pressure cannot be obtained only when a reaction layer is soft.

From the aforementioned viewpoints, the incorporated amount of the oxidizer used in the polishing liquid for metal of the present invention is necessary to be 7.0% by weight or more, preferable to be 7.5% by weight or more, more preferable to be 8.5% by weight or more, and particularly preferable to be 9.0% by weight or more, provided that the overall amount of the polishing liquid for metal is let be 100% by weight, in view of the balance between the thickness and the hardness of a reaction layer. Since the reaction layer to be formed on the surface of an object to be polished tends to become harder as the oxidizer concentration increases, the upper limit of the incorporated amount is preferably adjusted to 20 parts by weight or less relative to 100 parts of the polishing liquid for metal because a favorable polishing rate can be obtained.

When hydrogen peroxide, which is the most suitable as an oxidizer for metal, is used, the incorporated amount is determined according to the amount of hydrogen peroxide actually contained that is calculated from the concentration. That is, since hydrogen peroxide is commercially sold in the form of an aqueous solution having a concentration of several % to several tens %, an aqueous solution is incorporated so that the amount of hydrogen peroxide will become the aforementioned incorporated amount finally.

(Reacted Layer)

As described above, the use of such a polishing liquid composition that can form a "thick and soft" reaction layer is probably a factor that is important for obtaining effects that a good polishing rate can be obtained even at a low polishing pressure of 1.5 psi or lower or 1.0 psi or lower, for example, that a polished surface after the completion of polishing is excellent in planarity, and that the initial polishing rate is high. This reaction layer is assumed to be a material like a three-component complex of a water-soluble polymer, a metal anticorrosive agent, and a wiring metal (for example, copper based metal).

The thickness of the reaction layer can be determined by immersing a wafer comprising a silicon substrate and a copper foil with a thickness of 500 nm or more laminated on the substrate in a polishing liquid at 25° C. for 12 hours, then washing the wafer with water to prepare a sample for observation, and observing a cross section of the sample with an SEM. The thickness is preferably 110 nm or more, and more preferably 120 nm or more.

The hardness of the reaction layer can be determined by measuring the surface of a wafer immersed in a polishing liquid in the same manner as described above by using a dynamic micro hardness tester (nanointender). Specifically, it is preferably 1.5 GPa or less, more preferably 1.4 GPa or less, even more preferably 1.3 GPa or less, and particularly preferably 1.2 GPa or less.

It is desirable that both the thickness and the hardness satisfy the aforementioned preferable ranges. That is, when a reaction layer is "thick but hard," the polishing rate rather tends to decrease. On the contrary, when a reaction layer is "soft but thin," the reaction layer is easy to be polished, but there is only a little reaction layer to be polished. As a result, the polishing rate tends to decrease.

Therefore, preferably, the polishing liquid of the present invention contains at least water-soluble polymer and a metal anticorrosive agent and has a property to form a reaction layer having a thickness of 110 nm or more and a hardness of 1.5 Gpa or less when a wafer comprising a silicon substrate and a copper foil with a thickness of 500 nm or more laminated on the substrate is immersed therein at 25° C. for 12 hours.

(Polishing Particle)

Examples of polishing particles include polishing particles of inorganic substance, such as silica, alumina, zirconia, ceria, titania, germania, and silicon carbide, and polishing particles of organic substance, such as polystyrene, polyacrylic acid, and polyvinyl chloride. Among these, silica or alumina is preferred, and colloidal silica or colloidal alumina is more preferred.

(Primary Particle Diameter)

The average particle diameter of primary particles (henceforth, sometimes referred to simply as primary particle diameter) of the polishing particles to be used is preferably 50 nm or less, more preferably 40 nm or less, and particularly preferably 30 nm or less because the dispersion stability in a polishing liquid is good and the number of polishing scratches formed by CMP is small.

As to the method for measuring the primary particle diameter, it can be measured with a conventional transmission electron microscope (for example, H-7100FA, manufacture by Hitachi, Ltd.). For example, an image of particles is taken with the aforementioned electron microscope. Then, a biaxial average primary particle diameter is calculated for a prescribed number of particles and the average thereof is determined. When the particle size distribution is wide, the prescribed number should be such a number that the average is stabilized. When colloidal silica or colloidal alumina is used as polishing particles, the number of particles to be measured may be about 20, for example, because their particles are generally uniform in particle size.

Figure 5:
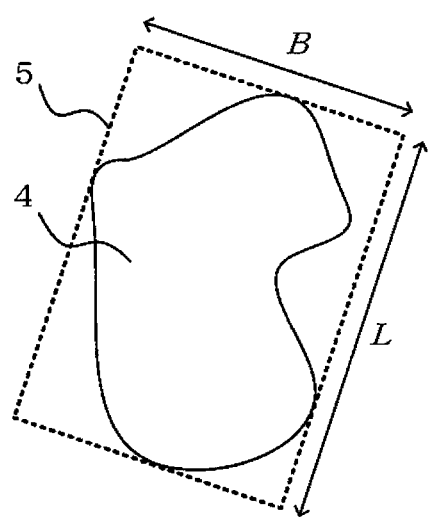
FIG. 5 shows one example of a particle shape for which a biaxial average primary particle diameter is to be calculated.

When a particle chosen has a shape shown in FIG. 5, a rectangle (circumscribed rectangle 5) that circumscribes to the particle 4 and is arranged so that its major axis may become the longest is drawn. The major axis and the minor axis of the circumscribed rectangle 5 are let be L and B, respectively, and then the biaxial average primary particle diameter of one particle is calculated as (L+B)/2. This operation is conducted for arbitrary 20 particles and the average of the values obtained is referred to as the biaxial average primary particle diameter (R1) in the present invention. This operation can be automated by using a computer program.

This operation may also be performed by using commercially available image processing software. While an electron micrograph is obtained usually as an image data of gray scale, an image data from which the boundaries of particles can be recognized visually is prepared first. Next, the image data is scanned by using image processing software like Photoshop® 7.01 available from Adobe®. Then, color correction in Image menu is chosen and a threshold of the boundary to be black-and-white converted is set.

When color correction in Image menu is chosen, a histogram of the luminance level of pixels in the a selected range is displayed in a black-and-white conversion dialog box. When the image data is in gray scale as mentioned above, two or more peaks are usually observed in the histogram and therefore a value that best reflects the profile of a particle is chosen as a threshold. As for the particle shape determined by such procedures, a circumscribed rectangle is established as mentioned above and a biaxial average primary particle diameter can be calculated.

(Standard Deviation of Particle Size Distribution)

Moreover, it is desirable from the viewpoint of polishing properties and handleability that the particles be uniform in diameter, and specifically, the standard deviation of the average particle size distribution is preferably 10 nm or less, and more preferably 5 nm or less. As to the method for measuring the particle size distribution, polishing particles in a polishing liquid are charged into a COULTER N4SD manufactured by COULTER Electronics, and a value of standard deviation can be obtained from a chart of particle size distribution.

(Secondary Particle Diameter)

The average particle diameter of secondary particles (henceforth, sometimes referred to simply as secondary particle diameter) of the polishing particles to be used is preferably 100 nm or less, more preferably 80 nm or less, and particularly preferably 60 nm or less because generation of polishing scratches is inhibited and polishing particles becomes easier to disperse during the preparation of a polishing liquid. The secondary particle diameter as referred to herein is not the particle diameter of an agglomerate in a polishing liquid but the secondary particle diameter of a polishing particle before being incorporated into the polishing liquid.

The secondary particle diameter can be measured, for example, by preparing a sample in which the aforementioned polishing particles are dispersed in water and the secondary particle diameter is measured by using a light diffraction/scattering type particle size distribution analyzer. Specifically, the measurement is performed, for example, by using a COULTER N4SD manufactured by COULTER Electronics at a measurement temperature of 20° C., a solvent refractive index of 1.333 (water), an unknown particle refractive index (set), a solvent viscosity of 1.005 cp (water), a run time of 200 sec, a laser incidence angle of 90°, and an intensity (i.e., scattering intensity, which corresponds to turbidity) falling within the range of 5E+04 to 4E+05. When the intensity is higher than 4E+05, the measurement may be performed after diluting the polishing liquid with water. Since the colloidal particles described later are usually obtained in a state that the particles have been dispersed in water, the measurement may also be carried out after diluting the dispersion to the aforementioned concentration.

(Degree of Association)

The polishing particles to be used for the polishing liquid of the present invention are preferably agglomerated particles formed from primary particles agglomerated to some extent. In polishing a "thick and soft" reaction layer formed from the polishing liquid of the present invention, the degree of association of particles is preferably 1.1 or more, and more preferably 1.2 or more in view of being excellent in planarity. The upper limit of the degree of association varies according to the primary particle diameters of the polishing particle to be used, and it should be just required that the secondary particle diameter fall within the aforementioned range. Although there usually is a tendency that agglomeration of particles is not preferred very much in a polishing liquid, the reason why agglomeration to a certain degree is preferred in the polishing liquid of the present invention has not been known in detail. The degree of association can be obtained by determining a secondary particle diameter and a primary particle diameter by the procedures described above and calculating the ratio thereof (secondary particle diameter/primary particle diameter).

(Particle Diameter in Polishing Liquid)

It is desirable for the polishing liquid of the present invention that the polishing particles have an average particle diameter and a degree of association equivalent to the aforementioned secondary particle diameter also in the polishing liquid. That is, the median of secondary particle diameters in a polishing liquid (henceforth, slurry particle diameter) is preferably 100 nm or less, more preferably 80 nm or less, and even more preferably 60 nm or less. The slurry particle diameter can be measured by using a laser diffraction type particle size distribution analyzer, such as Mastersizer manufactured by Malvern Instruments Ltd. and LA-920 manufactured by HORIBA, Ltd. Specifically, measurement is conducted for a liquid having a particle content of 1% or less under conditions including a relative index of refraction of 1.600, and a value obtained as D50 can be obtained as the median of secondary particle diameters (slurry particle diameter) in the polishing liquid, for example. When silica or alumina is used as polishing particles, since the existence state of the particles does not change greatly between a time of being raw materials and a time after being dispersed in a polishing liquid, the secondary particle diameter of the raw materials can be estimated from the particle diameter in the polishing liquid.

(Colloidal Particles)

Colloidal silica or colloidal alumina is preferred in that the particle diameter, the particle size distribution, and the degree of association thereof can be controlled easily. When polishing particles of them are used, an effect resulting from the control of the particle diameter, the particle size distribution and the degree of association can be obtained most easily. Therefore, colloidal silica or colloidal alumina having two or more properties among the primary particle diameter, the secondary particle diameter, the standard deviation of particle size distribution, and the degree of association is preferred. It is more preferable to have three or more properties, and it is most preferable to have all the properties.

Colloidal silica can be produced by a conventional production method using hydrolysis of a silicon alkoxide or ion exchange of sodium silicate. In view of particle diameter controllability or alkali metal impurity, a method of hydrolyzing a silicon alkoxide, such as tetramethoxysilane or tetraethoxysilane, is used most frequently. Colloidal alumina can be produced by a conventional production method using hydrolysis of aluminum nitrate.

(Concentration of a Polishing Particles)

Polishing with the polishing liquid of the present invention advances through the action of a frictional force applied between a polishing pad and a surface to be polished enhanced by the combined use of a metal anticorrosive agent and a water-soluble polymer and, therefore, substantially no polishing particles are required to be contained. However, in order to obtain a polishing rate to a low polishing pressure and a polishing rate in an initial stage of polishing, it is preferable that a very small amount of polishing particles be contained. From such a viewpoint, the content of polishing particles in the polishing liquid of the present invention is preferably 0.01% by weight or more, more preferably 0.05% by weight or more, and even more preferably 0.1% by weight or more, wherein the overall weight of the polishing liquid for metal film is let be 100% by weight. The upper limit is about 10% by weight in view of polishing rate. However, since the planarity exhibited after the completion of polishing tends to be poor if the content is excessively large, it is preferable that the polishing liquid of the present invention contain about 1.0% by weight or less of polishing particles in order to make the most of the properties of the polishing liquid.

(Metal Oxide Dissolving Agent)

It is presumed that the oxidized metal dissolving agent to be used in the present invention contributes to the acceleration of the polishing rate by dissolving particles of scraped wiring metal. Compounds having such a function are not particularly restricted as long as being water-soluble and include organic acids, organic acid esters, ammonium salts of organic acids, and ammonium salts of inorganic acids.

Specific examples of the oxidized metal dissolving agent include such organic acids as malonic acid, citric acid, malic acid, glycolic acid, glutamic acid, glyconic acid, oxalic acid, tartaric acid, picolinic acid, nicotinic acid, mandelic acid, picolinic acid, acetic acid, formic acid, succinic acid, adipic acid, glutaric acid, benzoic acid, qunaldinic acid, butyric acid, valeric acid, lactic acid, phthalic acid, fumaric acid, maleic acid, aminoacetic acid, salicylic acid, glyceric acid, and pimelic acid, esters of such organic acids, and ammonium salts of such organic acids; and such inorganic acids as sulfuric acid, nitric acid, phosphoric acid, acetic acid, and hydrochloric acid, and ammonium salts of such inorganic acids.

Among these, organic acids are suitable, and malic acid, citric acid, and succinic acid are more suitable. These oxidized metal dissolving agents may be used solely or as a combination of two or more of them. It is also effective to mix two or more acids or ammonium salts or organic acid esters because it is possible to control the etching rate effectively while maintaining a practically acceptable polishing rate.

The incorporated amount of the oxidized metal dissolving agent is preferably 0.001 to 10% by weight, more preferably 0.01 to 1% by weight, and particularly preferably 0.01 to 0.5% by weight relative to the overall amount of the polishing liquid for metal of the present invention. If the incorporated amount of the oxidized metal dissolving agent is 0.001% by weight or more, an effect of increasing the polishing rate tends to be observed, whereas if it is 10% by weight or less, the etching rate can be inhibited from becoming excessively high and the corrosion of a wiring metal tends to be able to be inhibited from progressing.

(pH)

The pH of the polishing liquid for metal film of the present invention is preferably within the range of 2.0 to 5.0. When the pH is 2.0 or more, it becomes easy to control such problems as corrosion of metal and roughness of a surface to be polished. Although one possible measure to decrease such problems as corrosion of metal and roughness of a surface to be polished is to increase the incorporated amount of the aforementioned metal anticorrosive agent, this may result in the occurrence of wiring defects due to excessive increase in friction between a polishing pad and a surface to be polished. On the other hand, if the pH is higher than 5.0, the incorporated amount of a metal anticorrosive agent can be reduced because there is less metal corrosion action, but there is a tendency that a sufficient polishing rate is difficult to be obtained. Therefore, it is considered that when the pH is 5.0 or lower, it is easy to obtain a reaction layer that is thick enough for obtaining a favorable polishing rate or a soft reaction layer.

From the above-mentioned viewpoints, the pH is preferably within the range of 2.0 to 5.0. From the viewpoint of controlling problems that arise on the surface to be polished, the pH is preferably 2.5 or more, and more preferably 3.0 or more. From the viewpoint of increasing the polishing rate, the pH is preferably 4.5 or less, and more preferably 4.3 or less. As mentioned above, in view of the overall balance, the pH is more preferably within the range of 2.5 to 4.5, and particularly preferably within the range of 3.0 to 4.3. The pH of a polishing liquid can be determined by performing a two-point calibration by the use of standard buffer solutions (a phthalic acid salt pH buffer solution having a pH of 4.21 (25° C.) and a neutral phosphoric acid salt pH buffer solution having a pH of 6.86 (25° C.)), then putting an electrode into the polishing liquid, and measuring a stabilized value after elapse of 2 minutes or more by using a pH meter (e.g., Model pH81 manufactured by Yokogawa Electric Corp.).

(Other Additives)

The polishing liquid for metal film of the present invention may contain, in addition to the aforementioned materials, a surfactant, a colorant, such as a pigment like Victoria Pure Blue and a dye like Phthalocyanine Green.

The film to be polished that is polished with the application of the polishing liquid for metal film of the present invention is preferably at least one member selected from among copper, a copper alloy, an oxide of copper, and an oxide of a copper alloy. Copper, a copper alloy, an oxide of copper, and an oxide of a copper alloy can be formed into a film by a conventional sputtering process and a conventional plating process.

The polishing liquids for metal film of the above-mentioned the present invention makes it possible to perform polishing at high rate even under a polishing pressure as low as 1.5 psi or less, particularly 1.0 psi or less. The polishing pressure is not particularly limited, and it may be chosen appropriately within the range of 0.5 psi to 7 psi (about 3.5 to about 50 kPa). Since interlayer insulation films low in dielectric constant and laminated films prepared by using such interlayer insulation films are low in mechanical strength, the polishing pressure is preferably 1.5 psi or less, more preferably less than 1.5 psi, even more preferably 1 psi or less, particularly preferably 0.5 to 1.0 psi, and extremely preferably 0.8 psi to 1.0 psi. It is noted that the polishing liquid for metal film of the present invention is characteristic in that polishing can be performed at a high speed under such a low polishing pressure, but it is not necessarily required to always perform polishing under a low polishing pressure.

(Storage Method)

It is also permissible for the polishing liquid of the present that the aforementioned components are prepared separately in two or more liquids and the liquids are mixed just before polishing so that the respective components may have prescribed concentrations. As for some components, the stability may be lost or polishing particles may agglomerate if they have been mixed beforehand. This problem can be solved by storing the components in two or more separated liquids as mentioned above. Moreover, there is an advantage that the amounts of respective components can be controlled through dilution according to the intended application. As to a specific separating method, for example, liquid A containing an oxidizer and liquid B in which a polishing liquid composition excluding the oxidizer are prepared separately and these are mixed just before polishing so that the components may have prescribed concentrations.

(Initial Polishing Rate)

The polishing liquid for metal film of the present invention can exhibit a high polishing rate in an initial stage of polishing, for example, at 60 seconds after the start of polishing, and therefore it can increase the polishing efficiency. Such a polishing rate in the initial stage of polishing can results in a high polishing rate also when a patterned substrate with level difference is polished.

One probable index showing that the polishing rate in an initial stage of polishing is high is that the ratio of the polishing rate of a patterned substrate with level difference (RRPTW) to the polishing rate of a non-patterned copper blanket substrate (RRBTW) (RRPTW/RRBTW) under the same polishing pressure is 0.4 or more.

More specifically, an example of the aforementioned patterned substrate with level difference is a silicon substrate 8 inches in diameter having a layer structure composed of (1) a substrate prepared by forming 350 nm thick silicon dioxide on a silicon substrate, and forming grooves so that the depth may become 350 nm and a 100 μm line-and-space pattern may be formed/(2) tantalum nitride 25 nm in thickness formed so as to follow the aforementioned irregularities as a barrier layer/(3) copper film 8.5 μm in thickness deposited so as to fill the irregularities.

An example of the aforementioned non-patterned copper blanket substrate is a silicon substrate 8 inches in diameter having a film structure composed of (1) a silicon substrate/(2) silicon dioxide 300 nm in thickness/(3) a barrier layer: tantalum nitride 25 nm in thickness/(4) copper film 1.5 μm in thickness. The initial polishing rate can be determined by measuring the difference in copper film thickness produced before and after performing CMP polishing under a polishing pressure o 2 psi for one minute.

While the initial polishing rate can be observed under a low polishing pressure as low as 1 psi, the difference in initial polishing rate between polishing liquids may become small. Therefore, it is preferable to measure it under a higher polishing pressure like 2 psi or more in order to find the tendency.

(Polishing Method)

The polishing method of the present invention is a method in which a film to be polished is polished by feeding the polishing liquid for metal film of the present invention onto a polishing cloth of a polishing platen, and relatively moving the polishing platen and a substrate with the film to be polished while holding the substrate pressed against the polishing cloth.

As a polishing apparatus, there can be used a common polishing apparatus that has a holder (head) for holding a substrate and a platen to which a polishing cloth (pad) can be attached and a motor or the like whose revolution speed can be changed has been mounted. As the polishing cloth, there can be used common nonwoven fabric, foamed polyurethane, and porous fluororesins. While there is no particular limitation, it is preferable to provide the polishing cloth with grooves which can contain a polishing liquid for metal film.

While the polishing condition is not particularly limited, a low rotation speed of the platen of 200 rpm or less is preferable so that the substrate does not jump out of the platen. The polishing pressure has been described above.

The polishing cloth and the film to be polished can be moved relatively while the film to be polished of the substrate is held pressed against the polishing cloth by, specifically, moving at least one of the substrate and the polishing platen. Polishing may be performed by rotating or shaking the holder instead of rotating the polishing platen. There can be mentioned a polishing method for rotating epicyclically a polishing platen and a polishing method for moving rectilinearly a belt-like polishing pad in one direction of the longitudinal direction. The holder may be in a fixed, rotated or shaken state. These polishing methods can be suitably selected according to the surface to be polished or the polishing apparatus as long as the polishing pad the film to be polished can be moved relatively to each other.

The method for supplying the polishing liquid for metal film of the invention to the polishing apparatus is not particularly restricted as long as the polishing liquid for metal film can be continuously supplied to the polishing cloth with a pump or the like during polishing. While the supplied amount is not limited, it is preferable that the surface of the polishing cloth be always covered with the polishing liquid for metal film.

When the polishing is completed, it is preferable that the substrate be washed thoroughly in flowing water, followed by removing water drops attached on the substrate with a spin drier or the like, and then drying.

While the polishing liquid for metal film of the present invention can be used particularly suitably for polishing of a film to be polished for LSI, it can be used also for polishing of a film to be polished for other applications, such as a magnetic recording head.

EXAMPLES

The present invention will be described with reference to examples below. The invention is not restricted by the examples.

Experiment Example 1

Polishing liquid (A) of pH 3.6 was prepared by incorporating, on the basis of the overall weight of the polyacrylic acid, 0.6% by weight of polyacrylic acid having a weight average molecular weight of 180,000, 0.17% by weight of colloidal silica polishing particles having a primary particle diameter of 17 nm and an average particle diameter of a secondary particle diameter of 35 nm, 0.15% by weight of citric acid, 0.08% by weight of 1,2,4-triazole, 50% by weight (15% by weight, expressed in the amount of hydrogen peroxide) of 30 wt %-concentration aqueous hydrogen peroxide solution (super special grade), 0.08% by weight of 25 wt %-concentration aqueous ammonia solution, and pure water so that the overall amount would become 100%.

The colloidal silica was prepared by hydrolysis of tetraethoxysilane in an ammonia solution.

The measurement of the weight average molecular weight of the polyacrylic acid was conducted by connecting a GPC column (Shodex Asahipak GF-710HQ) to an HPLC pump (L-7100, manufactured by Hitachi, Ltd.) equipped with a differential refractometer (Model L-3300, manufactured by Hitachi, Ltd.), and using a 50 mM aqueous disodium hydrogenphosphate solution/acetonitrile=90/10 (V/V) mixed solution as a mobile phase, at a flow rate of 0.6 ml/min, and a column temperature of 25° C.

Experiment Example 2

Polishing liquid (B) of pH 3.6 was prepared by repeating the operation of Experiment Example 1 except for using a polyacrylic acid having a weight average molecular weight of 220,000 instead of the polyacrylic acid having a weight average molecular weight of 180,000, and using malic acid instead of citric acid.

Experiment Example 3

Polishing liquid (C) of pH 3.6 was prepared by repeating the operation of Experiment Example 1 except for using a polyacrylic acid having a weight average molecular weight of 360,000 instead of the polyacrylic acid having a weight average molecular weight of 180,000, using malic acid instead of citric acid, and using benzotriazole instead of 1,2,4-triazole.

Experiment Example 4

Polishing liquid (D) of pH 3.6 was prepared by repeating the operation of Experiment Example 1 except for using a polyacrylic acid having a weight average molecular weight of 120,000 instead of the polyacrylic acid having a weight average molecular weight of 180,000, using succinic acid instead of citric acid, and using benzotriazole instead of 1,2,4-triazole.

Experiment Example 5

Polishing liquid (E) of pH 3.6 was prepared by repeating the operation of Experiment Example 1 except for using a polyacrylic acid having a weight average molecular weight of 630,000 instead of the polyacrylic acid having a weight average molecular weight of 180,000, and using malic acid instead of citric acid.

Experiment Example 6

Polishing liquid (F) of pH 3.6 was prepared by repeating the operation of Experiment Example 1 except for changing the used amount of the 30 wt %-concentration aqueous hydrogen peroxide solution (super special grade) from 50% 30% by weight (9% by weight, expressed in the amount of hydrogen peroxide).

Experiment Example 7

Polishing liquid (G) of pH 3.6 was prepared by repeating the operation of Experiment Example 1 except for changing the used amount of the 30 wt %-concentration aqueous hydrogen peroxide solution (super special grade) from 50% 10% by weight (3% by weight, expressed in the amount of hydrogen peroxide).

Experiment Example 8

Polishing liquid (H) of pH 3.6 was prepared by repeating the operation of Experiment Example 1 except for using a primary particle diameter of 25 nm and an average particle diameter of secondary particle diameter of 60 nm instead of the colloidal silica polishing particles having a primary particle diameter of 17 nm and an average particle diameter of secondary particle diameter of 35 nm.

Experiment Example 9

Polishing liquid (I) of pH 3.6 was prepared by repeating the operation of Experiment Example 1 except for using a copolymer of acrylic acid and methacrylic acid (copolymerization ratio 90:10) having a weight average molecular weight of 220,000 instead of the polyacrylic acid having a weight average molecular weight of 180,000.

Experiment Example 10

Polishing liquid (J) of pH 3.6 was prepared by repeating the operation of Experiment Example 1 except for changing the incorporated amount of the polyacrylic acid having a weight average molecular weight of 180,000 from 0.6% by weight to 0.008% by weight.

Experiment Example 11

Polishing liquid (K) of pH 3.6 was prepared by repeating the operation of Experiment Example 1 except for changing the incorporated amount of the polyacrylic acid having a weight average molecular weight of 180,000 from 0.6% by weight to 0.4% by weight.

Experiment Example 12

Polishing liquid (L) of pH 3.6 was prepared by repeating the operation of Experiment Example 1 except for changing the incorporated amount of the polyacrylic acid having a weight average molecular weight of 180,000 from 0.6% by weight to 0.07% by weight.

These compositions are summarized in Tables 1 and 2.

TABLE 1

|  |  | Experiment Example 1 | Experiment Example 2 | Experiment Example 3 |
|---|---|---|---|---|
|  | Polishing liquid | A | B | C |
| Water-soluble polymer | Compound | Polyacrylic acid | Polyacrylic acid | Polyacrylic acid |
|  | Weight average molecular weight | 180,000 | 220,000 | 360,000 |
|  | Amount (wt %) | 0.6 | 0.6 | 0.6 |
| Metal anti corrosive agent | Compound | 1,2,4-Triazole | 1,2,4-Triazole | Benzo triazole |
|  | Amount (wt %) | 0.08 | 0.08 | 0.08 |
| Oxidizer | Compound | Hydrogen peroxide | Hydrogen peroxide | Hydrogen peroxide |
|  | Amount (wt %) | 15 | 15 | 15 |
| Polishing particle | Kind | Colloidal silica | Colloidal silica | Colloidal silica |
|  | Primary particle diameter (nm) | 17 | 17 | 17 |
|  | Secondary particle diameter (nm) | 35 | 35 | 35 |
|  | Degree of association | 2.1 | 2.1 | 2.1 |
|  | Amount (wt %) | 0.17 | 0.17 | 0.17 |
| Metal oxide dissolving agent | Compound | Citric acid | Malic acid | Malic acid |
|  | Amount (wt %) | 0.15 | 0.15 | 0.15 |
| pH | pH value | 3.6 | 3.6 | 3.6 |
|  | pH adjuster | Aqueous ammonia solution | Aqueous ammonia solution | Aqueous ammonia solution |

|  |  | Experiment Example 4 | Experiment Example 5 | Experiment Example 6 |
|---|---|---|---|---|
|  | Polishing liquid | D | E | F |
| Water-soluble polymer | Compound | Polyacrylic acid | Polyacrylic acid | Polyacrylic acid |
|  | Weight average molecular weight | 120,000 | 63,000 | 180,000 |
|  | Amount (wt %) | 0.6 | 0.6 | 0.6 |
| Metal anti corrosive agent | Compound | Benzo triazole | 1,2,4-Triazole | 1,2,4-Triazole |
|  | Amount (wt %) | 0.08 | 0.08 | 0.08 |
| Oxidizer | Compound | Hydrogen peroxide | Hydrogen peroxide | Hydrogen peroxide |
|  | Amount (wt %) | 15 | 15 | 9.0 |
| Polishing particle | Kind | Colloidal silica | Colloidal silica | Colloidal silica |
|  | Primary particle diameter (nm) | 17 | 17 | 17 |
|  | Secondary particle diameter (nm) | 35 | 35 | 35 |
|  | Degree of association | 2.1 | 2.1 | 2.1 |
|  | Amount (wt %) | 0.17 | 0.17 | 0.17 |
| Metal oxide dissolving agent | Compound | Succinic acid | Malic acid | Citric acid |
|  | Amount (wt %) | 0.15 | 0.15 | 0.15 |
| pH | pH value | 3.6 | 3.6 | 3.6 |
|  | pH adjuster | Aqueous ammonia solution | Aqueous ammonia solution | Aqueous ammonia solution |

TABLE 2

|  |  | Experiment Example 7 | Experiment Example 8 | Experiment Example 9 |
|---|---|---|---|---|
|  | Polishing liquid | G | H | I |
| Water-soluble polymer | Compound | Polyacrylic acid | Polyacrylic acid | Acrylic acid-Methacrylic acid copolymer |
|  | Weight average molecular weight | 180,000 | 180,000 | 220,000 |
|  | Amount (wt %) | 0.6 | 0.6 | 0.6 |
| Metal anti corrosive agent | Compound | 1,2,4-Triazole | 1,2,4-Triazole | 1,2,4-Triazole |
|  | Amount (wt %) | 0.08 | 0.08 | 0.08 |
| Oxidizer | Compound |  | Hydrogen peroxide |  |
|  | Amount (wt %) | 3.0 | 15 | 15 |

TABLE 2-continued

|  |  |  |  |  |
|---|---|---|---|---|
| Polishing particle | Kind | Colloidal silica | Colloidal silica | Colloidal silica |
|  | Primary particle diameter (nm) | 17 | 25 | 17 |
|  | Secondary particle diameter (nm) | 35 | 60 | 35 |
|  | Degree of association | 2.1 | 2.5 | 2.1 |
|  | Amount (wt %) | 0.17 | 0.17 | 0.17 |
| Metal oxide dissolving agent | Compound | Citric acid | Citric acid | Citric acid |
|  | Amount (wt %) | 0.15 | 0.15 | 0.15 |
| pH | pH value | 3.6 | 3.6 | 3.6 |
|  | pH adjuster | Aqueous ammonia solution | | |

|  |  | Experiment Example 10 | Experiment Example 11 | Experiment Example 12 |
|---|---|---|---|---|
| Polishing liquid | | J | K | L |
| Water-soluble polymer | Compound | Polyacrylic acid | Polyacrylic acid | Polyacrylic acid |
|  | Weight average molecular weight | 180,000 | 180,000 | 180,000 |
|  | Amount (wt %) | 0.008 | 0.4 | 0.07 |
| Metal anti corrosive agent | Compound | 1,2,4-Triazole | 1,2,4-Triazole | 1,2,4-Triazole |
|  | Amount (wt %) | 0.08 | 0.08 | 0.08 |
| Oxidizer | Compound | Hydrogen peroxide | Hydrogen peroxide | Hydrogen peroxide |
|  | Amount (wt %) | 15 | 15 | 15 |
| Polishing particle | Kind | Colloidal silica | Colloidal silica | Colloidal silica |
|  | Primary particle diameter (nm) | 17 | 17 | 17 |
|  | Secondary particle diameter (nm) | 35 | 35 | 35 |
|  | Degree of association | 2.1 | 2.1 | 2.1 |
|  | Amount (wt %) | 0.17 | 0.17 | 0.17 |
| Metal oxide dissolving agent | Compound | Citric acid | Citric acid | Citric acid |
|  | Amount (wt %) | 0.15 | 0.15 | 0.15 |
| pH | pH value | 3.6 | 3.6 | 3.6 |
|  | pH adjuster | Aqueous ammonia solution | Aqueous ammonia solution | Aqueous ammonia solution |

Polishing performance was evaluated by the following method using polishing liquids (A) to (L) obtained in Experiment Examples 1 to 12.

(Polishing Conditions)

Substrate (I): Non-patterned blanket silicon substrate having a diameter of 8 inches (Film structure: silicon substrate/silicon dioxide film 300 nm in thickness/barrier layer: tantalum nitride film 25 nm in thickness/copper film 1.5 μm in thickness)

Substrate (II): Patterned silicon substrate 8 inches in diameter (silicon substrate/silicon dioxide film 35 nm in thickness having grooves 350 nm in depth/barrier layer: tantalum nitride film 25 nm in thickness/copper film 0.85 μm in thickness)

As to the substrate (II), the silicon dioxide film 250 nm in thickness as an interlayer dielectric was formed on the silicon substrate by the CVD process. On this interlayer dielectric, grooves having a depth of 350 nm were formed by a photolithography method so that wiring metal parts having a width of 100 μm and interlayer dielectric parts having a width of 100 μm would be arranged alternately, to produce depressions (grooved portions) and projections (non-grooved portions) on the surface. Furthermore, a tantalum nitride film 25 nm in thickness as a barrier layer was formed on this surface by the sputtering process. On the tantalum nitride film, a copper film 0.85 μm in thickness was formed as a conductive substance layer by the electroplating process so that all the grooves would be filled.

In the tables, BTW represents a blanket wafer and PTW represents a patterned wafer.

Polishing pad: Product No. IC1000, manufactured by Rodel Inc.

Polishing pressure: 2 psi (about 14.0 kPa), 1 psi (about 7.0 kPa)

Revolution speed of polishing platen: 93 rpm

Revolution speed of wafer-attached head: 87 rpm

Supply rate of polishing liquid: 200 ml/minute (Evaluation Item of Polishing Liquid)

(1) Polishing rate: The difference of the thickness of a copper film before and after CMP polishing substrate (I) with the aforementioned polishing liquids for one minute at a polishing pressure of 2 psi or 1 psi was determined through conversion from an electric resistance value.

(2) Initial polishing rate: The difference of the thickness of a copper film before and after CMP polishing substrate (II) with the aforementioned polishing liquids for one minute at a polishing pressure of 2 psi was determined through conversion from an electric resistance value.

(3) Amount of dishing: The surface of substrate (II) was polished until the barrier layer of tantalum nitride of projections came to be exposed. The reduction in film thickness (magnitude of dishing) of the wiring metal portion to the insulated film portion was then obtained, by using a surface profilometer, from the surface configuration of the stripe-like pattern portion in which the wiring metal portions of 100 μm width and the insulating film portions of 100 μm width were alternately arranged.

The evaluation results of (1) to (3) are shown in Table 3.

TABLE 3

| Experiment Example | | 1 | 2 | 3 | 4 | 5 | 6 |
|---|---|---|---|---|---|---|---|
| BTW polishing rate (nm/min) | Polishing liquid | A | B | C | D | E | F |
| | Polishing pressure 2 psi | 630 | 642 | 646 | 615 | 295 | 720 |
| | Polishing pressure 1 psi | 330 | 349 | 357 | 105 | 50 | 390 |
| PTW initial polishing rate (nm/min) | | 330 | 322 | 357 | 113 | 50 | 335 |
| Amount of dishing (nm) | | 45 | 38 | 30 | 40 | 35 | 60 |
| Experiment Example | | 7 | 8 | 9 | 10 | 11 | 12 |
| BTW polishing rate (nm/min) | Polishing liquid | G | H | I | J | K | L |
| | Polishing pressure 2 psi | 820 | 641 | 700 | 150 | 510 | 330 |
| | Polishing pressure 1 psi | 190 | 341 | 365 | 30 | 290 | 170 |
| PTW initial polishing rate (nm/min) | | 360 | 375 | 400 | 10 | 230 | 120 |
| Amount of dishing (nm) | | 80 | 35 | 60 | —* | 38 | 50 |

*The Cu film on the barrier film was not removed even thought the polishing tune was lengthened.

In Experiment Examples 1-3, 6, 8, 9, 11, and 12, high polishing rates were exhibited for blanket substrates under both polishing pressures of 2 psi (about 14.0 kPa) and 1 psi (about 7.0 kPa), also high initial polishing rates were exhibited for patterned substrates and good dishing properties were obtained.

In Experiment Example 4 using a polyacrylic acid having a weight average molecular weight of 120,000, the polishing rate under a polishing pressure of 1 psi dropped rapidly in comparison to the polishing rate under a polishing pressure of 2 psi for blanket substrates. Moreover, the initial polishing rate dropped for patterned substrates. In Experiment Example 5 using a polyacrylic acid having a weight average molecular weight of 630,000, the polishing rate dropped under both polishing pressures of 2 psi and 1 psi for blanket substrates and the initial polishing rate dropped for patterned substrates.

In Experiment Example 7 in which the hydrogen peroxide concentration was adjusted to 3% by weight, the polishing rate dropped under a polishing pressure of 1 psi and the amount of dishing deteriorated in comparison to the other polishing liquids. In Experiment Example 10 in which the incorporated amount of the polyacrylic acid was adjusted to 0.008% by weight, the polishing rate dropped for blanket substrates under both polishing pressures of 2 psi and 1 psi, and the initial polishing rate dropped for patterned substrates and no barrier film was exposed even though the polishing time was lengthened to 200 seconds or more. In Experiment Example 12, since the incorporated amount of the water-soluble polymer was small, the polishing rate was slightly low, but in comparison with Experiment Example 10 in which the added amount was smaller, the difference between the polishing rate under 2 psi and the polishing rate under 1 psi became as small as twice or less, and the initial polishing rate also increased.

(4) 2nd-Stage Polishing of Patterned Wafer

Using polishing liquid (A) to (L) obtained in Experiment Examples 1 to 12, substrate (II) was polished under the polishing conditions given below under a polishing pressure of 2 psi until the thickness of remaining copper film became 2000 A. Next, the polishing pressure was reduced to 1 psi, then polishing was performed and the time required for the tantalum nitride barrier layer to be exposed throughout the surface was measured.

The reduction in film thickness (magnitude of dishing) of the wiring metal portion to the insulated film portion was then obtained, by using a surface profilometer, from the surface configuration of the stripe-like pattern portion in which the wiring metal portions of 100 μm width and the insulating film portions of 100 μm width were alternately arranged. The results were shown in Table 4.

(Polishing Conditions)

Polishing pad: Product No. IC1000, manufactured by Rodel Inc.
Revolution speed of polishing platen: 93 rpm
Revolution speed of wafer-attached head: 87 rpm
Supply rate of polishing liquid: 200 ml/minute

TABLE 4

| Experiment Example | | 1 | 2 | 3 | 4 | 5 | 6 |
|---|---|---|---|---|---|---|---|
| PTW 2nd-stage polishing (1 psi) | Polishing liquid | A | B | C | D | E | F |
| | Polishing time (sec) | 70 | 65 | 63 | 110 | 130 | 65 |
| | Dishing (nm) | 40 | 38 | 43 | 40 | 42 | 55 |
| Experiment Example | | 7 | 8 | 9 | 10 | 11 | 12 |
| PTW 2nd-stage polishing (1 psi) | Polishing liquid | G | H | I | J | K | L |
| | Polishing time (sec) | 100 | 64 | 60 | 200 | 78 | 90 |
| | Dishing (nm) | 60 | 39 | 50 | —* | 45 | 48 |

*The Cu film on the barrier film was not removed even thought the polishing time was lengthened.

The polishing time given above is a time required from the start of polishing after the polishing pressure was reduced to 1 psi at the thickness of the remaining copper film of 2000 A until the tantalum nitride barrier layer became exposed.

In Experiment Examples 1-3, 6, 8, 9, 11, and 12, high polishing rates were obtained for patterned substrates under a polishing pressure of 1 psi and also good dishing properties were obtained. In Experiment Example 4 using a polyacrylic acid having a weight average molecular weight of 120,000 and Experiment Example 5 using a polyacrylic acid having a weight average molecular weight of 63,000, good dishing properties were exhibited, but the polishing time was longer than Experiment Examples 1 to 3 and high polishing rates were not obtained. Moreover, in Experiment Example 7 in which the aqueous hydrogen peroxide solution concentration was adjusted to 10% by weight and Experiment Example 10 in which the incorporated amount of the polyacrylic acid was adjusted to 0.008% by weight, the polishing time became longer than Experiment Examples 1-3, 6, 8, 9, 11, and 12. The Experiment Example 7, the dishing property were also inferior. In Experiment Example 12, since the added amount of the water-soluble polymer is small, but in Experiment Example 10, no barrier layer was exposed even though polishing was carried out for a long time as long as 200 seconds. Therefore, the polishing rate has been improved greatly.

The thickness of the reaction layer was determined by immersing wafers having a silicon substrate and a copper foil with a thickness of 500 nm or more laminated on the substrate respectively in polishing liquids A, E, F and G, which were similar in composition, at 25° C. for 12 hours, then washing the wafers with water to prepare samples for observation, and observing a cross section of the samples with an SEM. The hardness of the reaction layer was determined by measuring the surface of the wafers immersed in the respective polishing liquids in the same manner as described above by using a dynamic micro hardness tester (nanointender). The results are shown in Table 5 together with part of the composition and the evaluation given in Table 3.

TABLE 5

| Experiment Example | | 1 | 2 | 3 | 4 |
|---|---|---|---|---|---|
| Polishing liquid | | A | E | F | G |
| Water-soluble polymer | Compound | Polyacrylic acid | | | |
| | Weight average molecular weight | 180,000 | 63,000 | 180,000 | 180,000 |
| | Amount (wt %) | 0.6 | | | |
| Oxidizer | Compound | Hydrogen peroxide | | | |
| | Amount (wt %) | 15 | 15 | 9.0 | 3.0 |
| Polishing rate (nm/min) | Polishing pressure 2 psi | 630 | 295 | 720 | 820 |
| | Polishing pressure 1 psi | 330 | 50 | 390 | 190 |
| Initial polishing rate (nm/min) | | 330 | 50 | 335 | 360 |
| Amount of dishing (nm) | | 45 | 35 | 60 | 80 |
| Reaction layer thickness (nm) | | 130 | 100 | 140 | 90 |
| Reaction layer hardness (GPa) | | 1.5 | 1.1 | 0.85 | 0.5 |

Since polishing liquid E is smaller in weight average molecular weight than polishing liquid A, the reaction layer becomes thinner and the polishing rate is low when the polishing pressure is either high or low. Moreover, the initial polishing rate of a patterned substrate is also low. Since polishing liquid F contains less oxidizer than polishing liquid A, the reaction layer becomes softer. Since the oxidizer has been incorporated enough, the reaction layer is somewhat thick and a good polishing rate is exhibited. In Experiment Example 7, since little oxidizer is contained and the reaction layer is soft, the polishing rate is high at high pressures, but the amount of the oxidizer is excessively small, the reaction layer is thin and the polishing rate at low pressures is low.

INDUSTRIAL APPLICABILITY

According to the present invention, a polishing liquid for metal film by which polishing can be performed at a high rate even under a polishing pressure as low as 1 psi or lower and a polishing method using the polishing liquid can be provided.

Moreover, according to the present invention, a polishing liquid for metal film such that a polished film after polishing is excellent in planarity and a polishing method using the same can be provided.

Furthermore, according to the present invention, a polishing liquid for metal film with which a high polishing rate can be obtained even in an initial stage of polishing and a polishing method using the same can be provided.

The invention claimed is:

1. A polishing liquid for metal film comprising 7.0% by weight or more up to 20 parts by weight relative to 100 parts of the polishing liquid for metal film of hydrogen peroxide, 0.1% to 2% by weight of a water-soluble polymer based on the total weight of the polishing liquid for metal film, 0.01 to 1% by weight of an oxidized metal dissolving agent, 0.01% to 2.0% by weight of a metal anticorrosive agent and water,
   wherein the water-soluble polymer has a weight average molecular weight of 160,000 to 1,000,000 and is at least one member selected from the group consisting of a polyacrylic acid, a salt of a polyacrylic acid, and a polyacrylic acid ester,
   wherein the polishing liquid contains polishing particles comprising primary particles having an average particle diameter of up to 50 nm and secondary particles having an average particle diameter of up to 100 nm; the content of the polishing particles is 0.1% to about 1.0% by weight based on the total weight of the polishing liquid for metal film; and the polishing particles is colloidal silica,
   wherein the polishing liquid forms a reaction layer having a thickness of 110 nm or more, wherein the reaction layer thickness is measured by immersing a wafer comprising a silicon substrate and a copper foil with a thickness of 500 nm or more laminated on the substrate in the polishing liquid at 25° C. for 12 hours.

2. A polishing method in which a film to be polished is polished by feeding the polishing liquid for metal film of claim 1 onto a polishing cloth of a polishing platen, and relatively moving the polishing platen and a substrate with the film to be polished while holding the substrate pressed against the polishing cloth.

3. The polishing method of claim 2, wherein the film to be polished is at least one member selected from the group consisting of copper, a copper alloy, an oxide of copper, and an oxide of a copper alloy.

4. The polishing method of claim 2, wherein the polishing liquid forms a reaction layer on a wafer comprising a silicon substrate and a copper foil with a thickness of 500 nm or more laminated on the substrate is immersed in the polishing liquid at 25° C. for 12 hours, and the thickness of the reaction layer is 110 nm or more.

5. The polishing method of claim 2, wherein the polishing liquid forms a reaction layer on a wafer comprising a silicon substrate and a copper foil with thickness of 500 nm or more laminated on the substrate is immersed in the polishing liquid at 25° C. for 12 hours, and the hardness of the reaction layer measured by using a dynamic micro hardness tester is 1.5 GPa or less.

* * * * *